United States Patent
Ohse et al.

(10) Patent No.: US 10,283,591 B2
(45) Date of Patent: May 7, 2019

(54) SILICON CARBIDE SEMICONDUCTOR DEVICE AND METHOD OF MANUFACTURING THE SILICON CARBIDE SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Naoyuki Ohse, Matsumoto (JP); Yusuke Kobayashi, Tsukuba (JP); Takahito Kojima, Matsumoto (JP); Shinsuke Harada, Tsukuba (JP)

(73) Assignees: FUJI ELECTRIC CO., LTD., Kawasaki-Shi, Kanagawa (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/846,075

(22) Filed: Dec. 18, 2017

(65) Prior Publication Data

US 2018/0175147 A1    Jun. 21, 2018

(30) Foreign Application Priority Data

Dec. 20, 2016 (JP) ................................ 2016-247222

(51) Int. Cl.
*H01L 29/06* (2006.01)
*H01L 29/10* (2006.01)
(Continued)

(52) U.S. Cl.
CPC ...... *H01L 29/1041* (2013.01); *H01L 29/0623* (2013.01); *H01L 29/1095* (2013.01);
(Continued)

(58) Field of Classification Search
CPC ............. H01L 29/1041; H01L 29/1608; H01L 29/66068; H01L 29/7813
See application file for complete search history.

(56) References Cited

U.S. PATENT DOCUMENTS 6,057,558 A * 5/2000 Yamamoto .......... H01L 29/0847
257/77
2011/0024831 A1    2/2011 Nakano
(Continued)

FOREIGN PATENT DOCUMENTS

JP    2009-260253 A    11/2009
JP    2013-125827 A    6/2013

*Primary Examiner* — Joseph M Galvin, III
(74) *Attorney, Agent, or Firm* — Rabin & Berdo, P.C.

(57) ABSTRACT

A vertical MOSFET of a trench gate structure includes an $n^-$-type drift layer and a $p^+$-type base layer formed by epitaxial growth. The vertical MOSFET includes a trench that penetrates the $n^-$-type drift layer and the $p^+$-type base layer. A low-concentration thin film is provided in the trench. The low-concentration thin film is in contact with the $p^+$-type base layer and is of the same conductivity type as the $p^+$-type base layer. Further, the low-concentration thin film has an impurity concentration that is lower than that of the $p^+$-type base layer.

6 Claims, 16 Drawing Sheets

(51) Int. Cl.
   *H01L 29/66* (2006.01)
   *H01L 29/16* (2006.01)
   *H01L 29/78* (2006.01)
   *H01L 29/739* (2006.01)

(52) U.S. Cl.
   CPC .... *H01L 29/1608* (2013.01); *H01L 29/66068* (2013.01); *H01L 29/7395* (2013.01); *H01L 29/7813* (2013.01)

(56) References Cited

U.S. PATENT DOCUMENTS

| | | |
|---|---|---|
| 2013/0153995 A1 | 6/2013 | Misawa et al. |
| 2014/0159205 A1* | 6/2014 | Rezanezhad Gatabi .................... H01L 29/0638 257/547 |
| 2015/0179791 A1* | 6/2015 | Kudou ................ H01L 29/7813 257/77 |
| 2016/0099316 A1* | 4/2016 | Arai .................... H01L 29/1033 257/77 |

\* cited by examiner

SILICON CARBIDE SEMICONDUCTOR DEVICE AND METHOD OF MANUFACTURING THE SILICON CARBIDE SEMICONDUCTOR DEVICE

CROSS REFERENCE TO RELATED APPLICATIONS

This application is based upon and claims the benefit of priority of the prior Japanese Patent Application No. 2016-247222, filed on Dec. 20, 2016, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, vertical metal oxide semiconductor field effect transistors (MOSFETs) having a trench structure are produced (manufactured) to reduce element ON resistance in power semiconductor elements. In vertical MOSFETs, the cell density per unit area may be increased to a greater extent with a trench structure in which a channel is formed vertically with respect to the substrate surface as compared to a planar structure in which a channel is formed parallel to the substrate surface. As a result, the current density per unit are may be increased, which is advantageous in terms of cost.

However, when a trench structure is formed in a vertical MOSFET, to form a channel in a vertical direction, a structure is adopted in which a gate insulating film covers inner trench walls entirely. A portion of the gate insulating film at a bottom of the trench is near a drain electrode whereby a high electric field is likely to be applied to the portion of gate insulating film at the bottom of the trench. In particular, with wide bandgap semiconductors (semiconductors having a bandgap wider than that of silicon, e.g., silicon carbide (SiC)), since ultra-high voltage elements are produced, the gate insulating film at the bottom of the trench is adversely affected, causing reliability to decrease.

As a method to resolve such problems, a technique has been proposed in which a $p^+$-type base region is provided in a striped shape parallel to and between trenches in a vertical MOSFET that has a trench structure having a stripped planar pattern (for example, refer to Japanese Laid-Open Patent Publication No. 2009-260253). Another technique has been proposed in which at the bottoms of trenches, a $p^+$-type base region is provided in a stripped shape parallel to the trenches.

FIG. 17 is a cross-sectional view of a structure of a conventional silicon carbide semiconductor device. The conventional silicon carbide semiconductor device depicted in FIG. 17 includes a MOS gate of an ordinary trench gate structure on a front surface (surface on a $p^+$-type base layer 106 side) side of a semiconductor base (hereinafter, silicon carbide base) 10100 containing silicon carbide. The silicon carbide base (semiconductor chip) 10100 includes silicon carbide layers including an $n^-$-type drift layer 102, an n-type region 105 that is a current diffusion region, and a $p^+$-type base layer 106, sequentially formed by epitaxial growth on an $n^+$-type supporting substrate (hereinafter, $n^+$-type silicon carbide substrate) 101 containing silicon carbide.

A first $p^{++}$-type region 103 is selectively provided in the n-type region 105 so as to entirely cover a bottom of a trench 1018. The first $p^{++}$-type region 103 is provided at a depth not reaching the $n^-$-type drift layer 102. Further, a second $p^{++}$-type region 104 is selectively formed in the n-type region 105 between adjacent trenches 1018 (mesa portion). The second $p^{++}$-type region 104 contacts the $p^+$-type base layer 106 and is provided at a depth not reaching the $n^-$-type drift layer 102. Reference numerals 107, 108, 109, 1010, 1111, and 1012 are an $n^{++}$-type source region, a $p^{+++}$-type contact region, a gate insulating film, a gate electrode, an interlayer insulating film, and a source electrode, respectively.

In the vertical MOSFET of the configuration depicted in FIG. 17, the first $p^{++}$-type region 103 and a pn junction between the second $p^{++}$-type region 104 and the n-type region 105 is at a position deeper than the trench 1018. Therefore, electric field concentrates at the first $p^{++}$-type region 103 and the boundary between the second $p^{++}$-type region 104 and the n-type region 105, enabling the concentration of electric field at the bottom of the trench 1018 to be mitigated.

Further, in a conventional semiconductor device, to reduce the ON resistance, a thickness in a Z-direction (depth direction of the trench) of a field plate insulating film provided at the bottom of the trench is made thinner than a thickness of the field plate insulating film in an X-direction (width direction of the trench) whereby the semiconductor device enables the carrier concentration of the n-type base layer to be set higher (for example, refer to Japanese Laid-Open Patent Publication No. 2013-125827).

SUMMARY OF THE INVENTION

According to an embodiment of the present invention, a silicon carbide semiconductor device includes a silicon carbide substrate; a first semiconductor layer of a first conductivity type provided on a front surface of the silicon carbide substrate; a second semiconductor layer of a second conductivity type provided on a first side of the first semiconductor layer, opposite a second side of the first semiconductor layer facing the silicon carbide substrate; a first semiconductor region of the second conductivity type selectively provided in the second semiconductor layer, an impurity concentration of the first semiconductor region being higher than that of the second semiconductor layer; a trench penetrating the first semiconductor region and the second semiconductor layer, and reaching the first semiconductor layer; a semiconductor film provided in the trench, the semiconductor film being in contact with the second semiconductor layer and the first semiconductor layer; a gate electrode provided on the semiconductor film in the trench, via a gate insulating film; a first electrode in contact with the first semiconductor region and the second semiconductor layer; and a second electrode provided on a rear surface of the silicon carbide substrate. A region of the semiconductor film in contact with the second semiconductor layer is a region of the second conductivity type and has an impurity concentration lower than that of the second semiconductor layer.

In the embodiment, the region of the semiconductor film in contact with the second semiconductor layer is a region of the second conductivity type, has an impurity concentration lower than that of the second semiconductor layer, and is formed so as not to be provided at a bottom of the trench.

In the embodiment, the semiconductor film has a profile in which the impurity concentration decreases with proximity to a center of the trench.

According to another embodiment of the present invention, a method of manufacturing a silicon carbide semiconductor device includes providing a silicon carbide substrate; forming a first semiconductor layer of a first conductivity type on a front surface of a silicon carbide substrate; forming a second semiconductor layer of a second conductivity type on a first side of the first semiconductor layer, opposite a second side of the first semiconductor layer facing the silicon carbide substrate; selectively forming a first semiconductor region of the second conductivity type in the second semiconductor layer, an impurity concentration of the first semiconductor region is higher than that of the second semiconductor layer; forming a trench to penetrate the first semiconductor region and the second semiconductor layer, and reach the first semiconductor layer; forming a semiconductor film in the trench, the semiconductor film being in contact with the second semiconductor layer and the first semiconductor layer; forming a gate electrode on the semiconductor film in the trench, via a gate insulating film; forming a first electrode in contact with the first semiconductor region and the second semiconductor layer; and forming a second electrode on a rear surface of the silicon carbide substrate. In forming the semiconductor film, a region of the semiconductor film in contact with the second semiconductor layer is formed to be of the second conductivity type and have an impurity concentration lower than that of the second semiconductor layer.

In the embodiment, forming the semiconductor film includes: forming the semiconductor film on the first semiconductor region, on the second semiconductor layer, and in the trench, by epitaxial growth; removing the semiconductor film at a bottom of the trench; and making the region of the semiconductor film that is in contact with the second semiconductor layer to be of the second conductivity type and have an impurity concentration lower than that of the second semiconductor layer.

In the embodiment, removing the semiconductor film at the bottom of the trench includes thinning the semiconductor film on first semiconductor region, on the second semiconductor layer and on side walls of the trench and removing the semiconductor film at the bottom of the trench.

In the embodiment, the semiconductor film is formed to have a profile in which the impurity concentration decreases with proximity to a center of the trench, by a process of activating the first semiconductor region.

In the embodiment, the semiconductor film is formed to have a profile in which the impurity concentration decreases with proximity to a center of the trench, by an annealing process for the trench.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
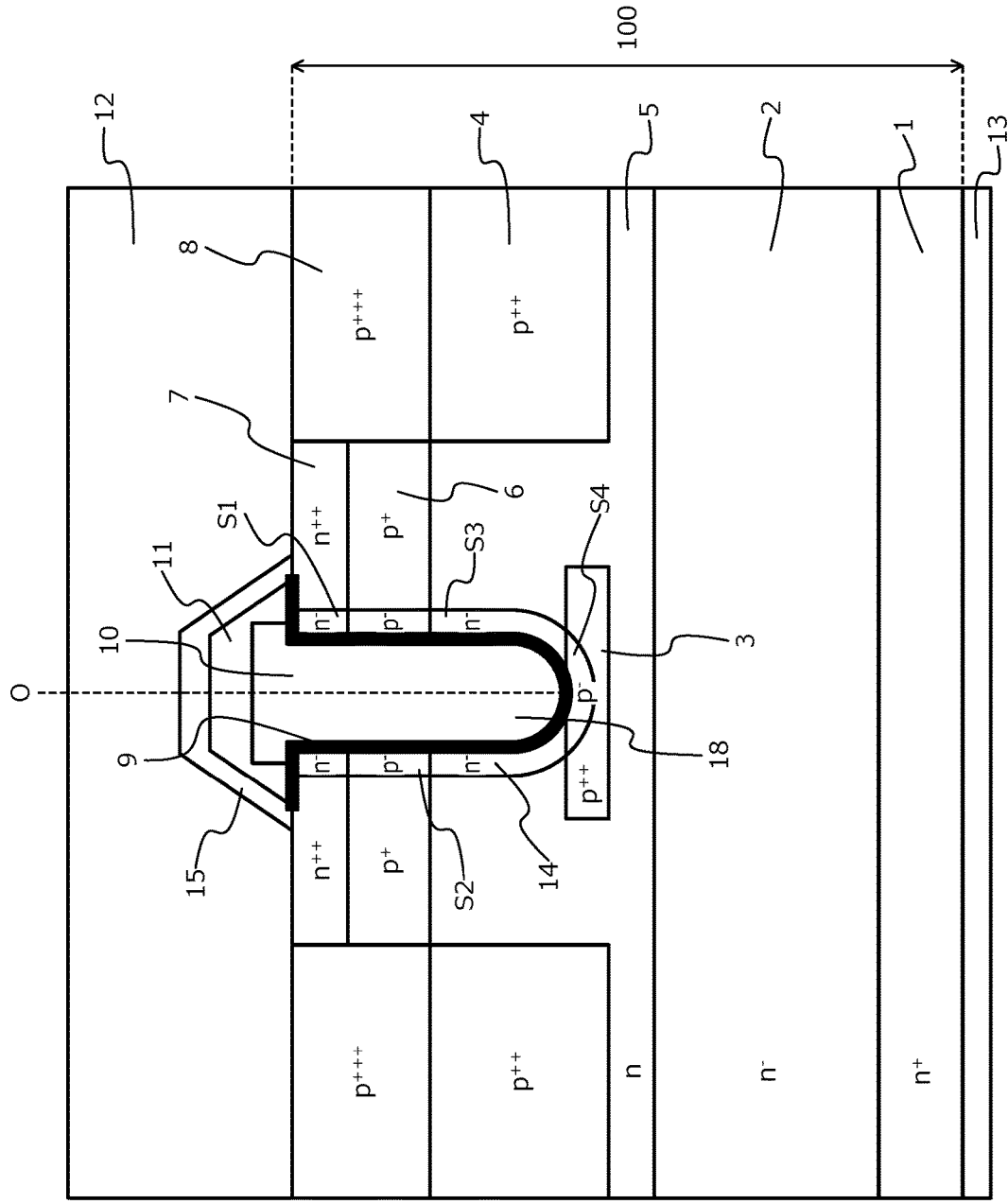
FIG. 1 is a cross-sectional view of a silicon carbide semiconductor device according to a first embodiment.

In the conventional structures, the length of a part of the trench in contact with the $p^+$-type base layer 106 is made short whereby the channel length is shortened to enable the ON resistance to be lowered further. However, when the channel length is shortened, the threshold voltage of the semiconductor device sharply decreases due to short channel effects. In this case, use of the conventional semiconductor device as a switching device is limited.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

A semiconductor device according to the present invention is formed using a semiconductor material (hereinafter, wide bandgap semiconductor material) having a bandgap wider than that of silicon. Here, a structure of a semiconductor device (silicon carbide semiconductor device) that uses, e.g., silicon carbide (SiC) as the wide bandgap semiconductor material will be described as an example. FIG. 1 is a cross-sectional view of a silicon carbide semiconductor device according to a first embodiment. In FIG. 1, only two unit cells (functional unit of an element) are depicted, other unit cells adjacent to these are omitted from the drawing. The silicon carbide semiconductor device according to the first embodiment and depicted in FIG. 1 is a MOSFET that includes a MOS gate on a front surface (surface on a p$^+$-type base layer 6 side) of a semiconductor base (silicon carbide base: semiconductor chip) 100 containing silicon carbide.

The silicon carbide base 100 includes silicon carbide layers including an n$^-$-type drift layer (first semiconductor layer) 2 and a p$^+$-type base layer (second semiconductor layer) 6, sequentially formed by epitaxial growth on an n$^+$-type supporting substrate (n$^+$-type silicon carbide substrate) 1 containing silicon carbide. The MOS gate is configured by the p$^+$-type base layer 6, an n$^{++}$-type source region (first semiconductor region) 7, a p$^{+++}$-type contact region 8, a trench 18, a gate insulating film 9, and a gate electrode 10. In particular, on a surface layer of the n$^-$-type drift layer 2, on a source side (side facing toward a source electrode 12) of the n$^-$-type drift layer 2, an n-type region 5 is provided so as to contact the p$^+$-type base layer 6. The n-type region 5 is a so-called current spreading layer (CSL) that reduces carrier spreading resistance. The n-type region 5 is provided, for example, uniformly in a direction (hereinafter, horizontal direction) parallel to a base front surface (front surface of the silicon carbide base 100).

In the n-type region 5, a first p$^{++}$-type region 3 and a second p$^{++}$-type region 4 are each selectively provided. The first p$^{++}$-type region 3 is provided so as to cover a bottom and a corner portion of the bottom of the trench 18. The corner portion of the bottom of the trench 18 is a boundary of the bottom and a side wall of the trench 18. The first p$^{++}$-type region 3 is provided from a position deeper on the drain side than an interface of the p$^+$-type base layer 6 and the n-type region 5, at a depth not reaching an interface of the n-type region 5 and the n$^-$-type drift layer 2. Provision of the first p$^{++}$-type region 3 enables a pn junction between the first p$^{++}$-type region 3 and the n-type region 3 to be formed near the bottom of the trench 18.

The second p$^{++}$-type region 4 is provided between adjacent trenches 18 (mesa portion), so as to be separated from the first p$^{++}$-type region 3 and in contact with the p$^+$-type base layer 6. A part of the second p$^{++}$-type region 4 may extend toward the trench 18 and partially contact the first p$^{++}$-type region 3. Further, the second p$^{++}$-type region 4 is provided from the interface of the p$^+$-type base layer 6 and the n-type region 5, at a depth not reaching the interface of the n-type region 5 and the n$^-$-type drift layer 2. Provision of the second p$^{++}$-type region 4 enables a pn junction between the second p$^{++}$-type region 4 and the n-type region 5 to be formed between adjacent trenches 18, at a position deeper on the drain side than the bottom of the trench 18. Formation of the first p$^{++}$-type region 3 and the pn junction between the second p$^{++}$-type region 4 and the n-type region 5 enables prevention of an application of high electric field at a part of the gate insulating film 9 at the bottom of the trench 18.

In the p$^+$-type base layer 6, the n$^{++}$-type source region 7 and the p$^{+++}$-type contact region 8 are each selectively provided so as to contact each other. A depth of the p$^{+++}$-type contact region 8 may be, for example, a same depth as that of the n$^{++}$-type source region 7, or may be deeper than that of the n$^{++}$-type source region 7.

The trench 18 penetrates the n$^{++}$-type source region 7 and the p$^+$-type base layer 6 from the base front surface and reaches the n-type region 5 and the first p$^{++}$-type region 3. In the trench 18, a low-concentration thin film 14 is provided. Due to the low-concentration thin film 14, a channel surface impurity concentration may be decreased; additionally, channel region resistance increases, enabling decreases in the threshold voltage to be prevented.

The low-concentration thin film 14 contacts the n$^{++}$-type source region 7, the p$^+$-type base layer 6, the n-type region 5, and the first p$^{++}$-type region 3. The low-concentration thin film 14 has same conductivity types as those of the contacting regions and impurity concentrations that are lower than those of the contacting regions. For example, a region S1 of the low-concentration thin film 14 in contact with n$^{++}$-type source region 7 is an n$^-$-type and has an impurity concentration lower than that of the n$^{++}$-type source region 7. Further, a region S2 of the low-concentration thin film 14 in contact with p$^+$-type base layer 6 is a p$^-$-type and has an impurity concentration that is lower than that of the p$^+$-type base layer 6. A region S3 of the low-concentration thin film 14 in contact with the n-type region 5 is an n$^-$-type and has an impurity concentration that is lower than that of the n-type region 5. A region S4 of the low-concentration thin film 14 in contact with first p$^{++}$-type region 3 is a p$^-$-type and has an impurity concentration that is lower than that of the first p$^{++}$-type region 3. Due to the region S2 of the low-concentration thin film 14 in contact with p$^+$-type base layer 6, the channel surface impurity concentration may be reduced; additionally, the channel region resistance increases, enabling decreases in the threshold voltage to be prevented. Further, a film thickness of the low-concentration thin film 14 may be such that an aspect ratio of the channel length and the film thickness of the low-concentration thin film 14 becomes 2 or more. For example, when the channel length is 0.4 μm, the film thickness of the low-concentration thin film 14 may be set to be 0.2 μm or less, and the channel length/the film thickness of the low-concentration thin film 14 may be set to be 2.

The low-concentration thin film 14 has a profile in which the impurity concentration decreases with proximity to a center O of the trench 18. In particular, the impurity concentration of the low-concentration thin film 14 is highest at the regions thereof respectively in contact with n$^{++}$-type source region 7, the p$^+$-type base layer 6, the n-type region 5, and the first p$^{++}$-type region 3; and the impurity concentration at a region of the low-concentration thin film 14 in contact with gate insulating film 9 (described hereinafter) is lowest. Because the impurity concentration is highest at the region in contact with p$^+$-type base layer 6, the low-concentration thin film 14 may further increase the channel region resistance.

In the trench 18, on the low-concentration thin film 14, the gate insulating film 9 is provided along the side walls of the trench 18; and on the gate insulating film 9, the gate electrode 10 is provided. An end of the gate electrode 10 on the source side may or may not protrude out from the base front surface. A part (not depicted) of the gate electrode 10 is electrically connected to a gate pad (not depicted). An interlayer insulating film 11 is provided on the entire base front surface so as to cover the gate electrode 10 embedded in the trench 18.

The source electrode (first electrode) 12 contacts the n$^{++}$-type source region 7 and the p$^{+++}$-type contact region 8, via a contact hole opened in the interlayer insulating film 11, and is electrically insulated from the gate electrode 10 by the interlayer insulating film 11. Between the source electrode 12 and the interlayer insulating film 11, for example, a nickel silicide film 15 that prevents diffusion of metal atoms from the source electrode 12 toward the gate electrode 10 is provided. On the source electrode 12, a source electrode pad (not depicted) is provided. On a rear surface (rear surface of the $n^+$-type silicon carbide substrate 1 that is an $n^+$-type drain region) of the silicon carbide base 100, a drain electrode (second electrode) 13 is provided.

The method of manufacturing a silicon carbide semiconductor device according to the first embodiment will be described. FIGS. 2, 3, 4, 5, 6, 7, and 8 are cross-sectional views of the silicon carbide semiconductor device according to the first embodiment during manufacture. First, the $n^+$-type silicon carbide substrate 1 that is the $n^+$-type drain region is prepared. Next, on the front surface of the $n^+$-type silicon carbide substrate 1, the $n^-$-type drift layer 2 is formed by epitaxial growth. For example, conditions of the epitaxial growth for forming the $n^-$-type drift layer 2 may be set so that the impurity concentration of the $n^-$-type drift layer 2 becomes about $8\times10^{15}/cm^3$.

Figure 2:
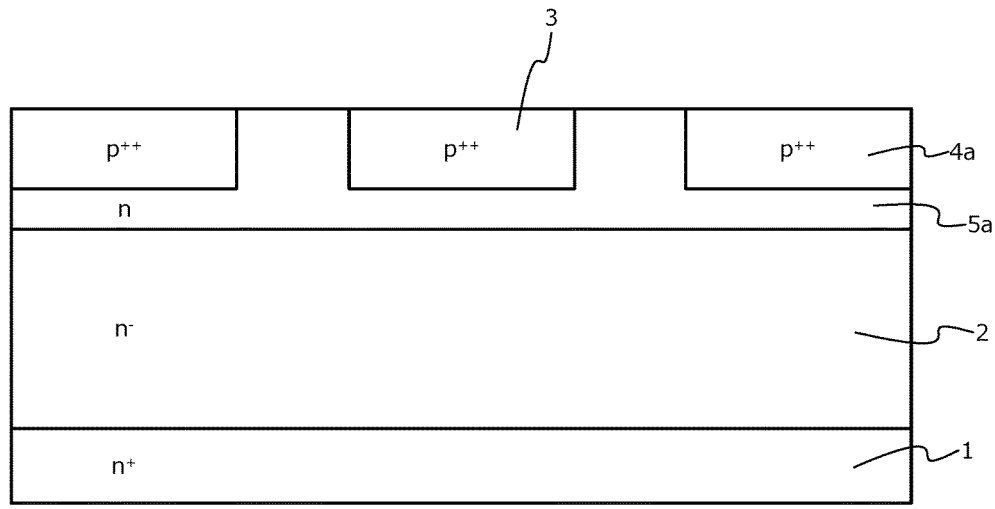
FIG. 2 is a cross-sectional view of the silicon carbide semiconductor device according to the first embodiment during manufacture.

Next, on the $n^-$-type drift layer 2, a lower n-type region 5a is formed by epitaxial growth. For example, conditions of the epitaxial growth for forming the lower n-type region 5a may be set so that the impurity concentration of the lower n-type region 5a becomes about $1\times10^{17}/cm^3$. The lower n-type region 5a is a part of the n-type region 5. Next, the first $p^{++}$-type region 3 and a lower second $p^{++}$-type region 4a are selectively formed in a surface layer of the lower n-type region 5a by photolithography and ion implantation of a p-type impurity. For example, a dose amount during the ion implantation for forming the first $p^{++}$-type region 3 and the lower second $p^{++}$-type region 4a maybe set so that the impurity concentration becomes about $5\times10^{18}/cm^3$. The state up to here is depicted in FIG. 2.

Figure 3:
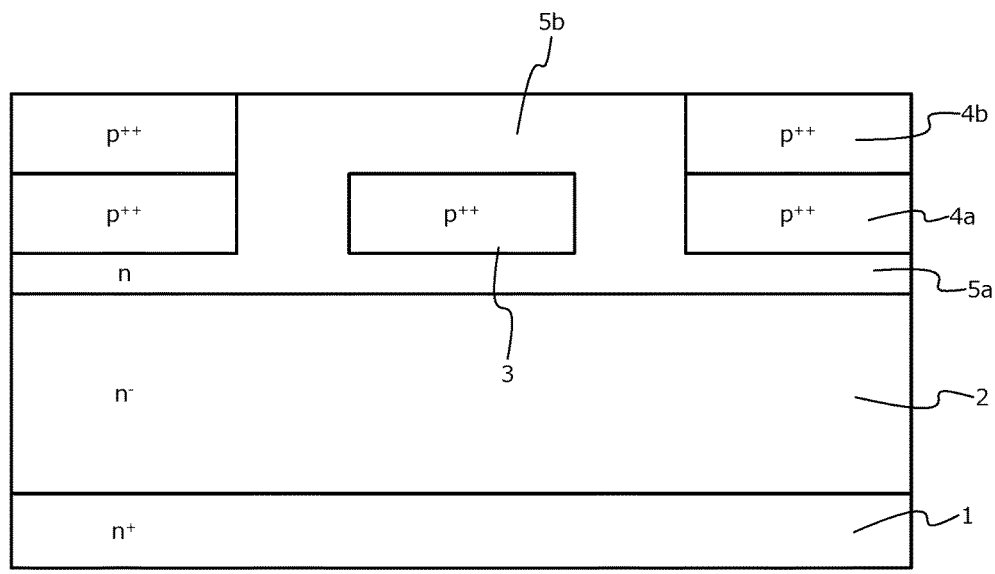
FIG. 3 is a cross-sectional view of the silicon carbide semiconductor device according to the first embodiment during manufacture.

Next, on the lower n-type region 5a and the lower second $p^{++}$-type region 4a, an upper n-type region 5b is formed by epitaxial growth. For example, the upper n-type region 5b conditions of the epitaxial growth for forming may be set so that the impurity concentration becomes about the same as the impurity concentration of the lower n-type region 5a. The upper n-type region 5b is a part of the n-type region 5, and the lower n-type region 5a and the upper n-type region 5b collectively become the n-type region 5. Next, in a surface layer of the upper n-type region 5b, an upper second $p^{++}$-type region 4b is selectively formed by photolithography and ion implantation of a p-type impurity. For example, a dose amount during the ion implantation for forming the upper second $p^{++}$-type region 4b may be set so that the impurity concentration becomes about the same as that of the lower second $p^{++}$-type region 4a. The state up to here is depicted in FIG. 3.

Next, on the upper n-type region 5b and the upper second $p^{++}$-type region 4b, the $p^+$-type base layer 6 is formed by epitaxial growth. For example, conditions of the epitaxial growth for forming $p^+$-type base layer 6 may be set so that the impurity concentration of the $p^+$-type base layer 6 becomes about $1\times10^{18}/cm^3$. Further, the conductivity type of the upper n-type region 5b may be inverted by ion implantation of a p-type impurity to thereby form the $p^+$-type base layer 6.

Figure 4:
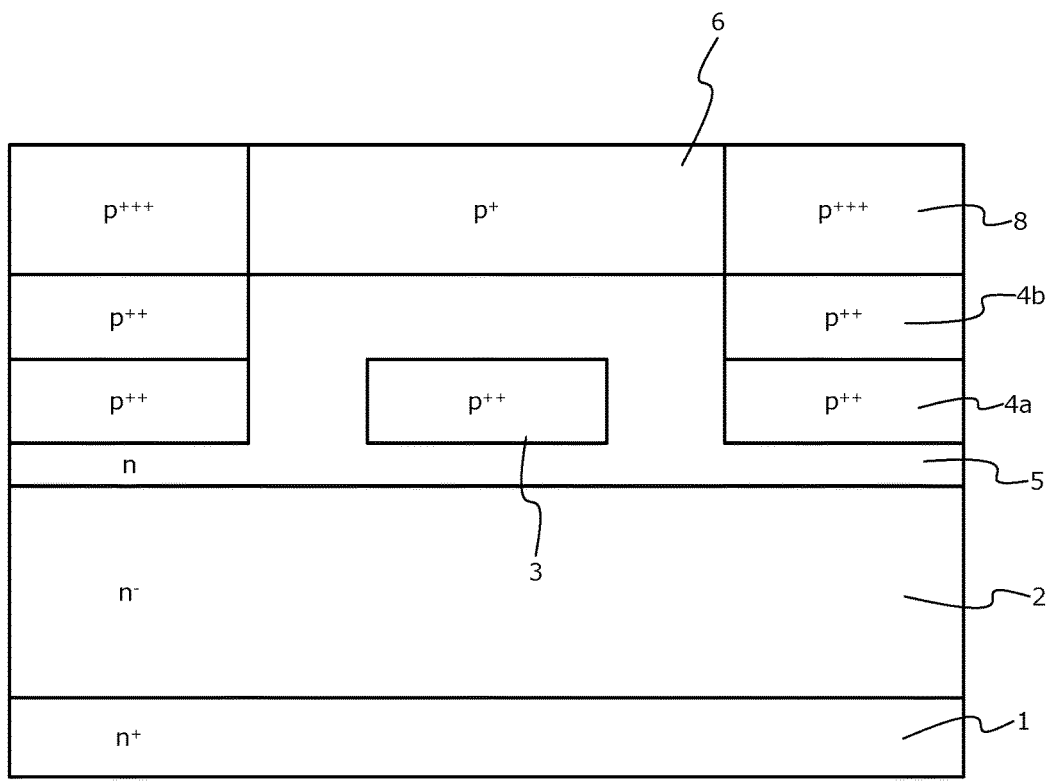
FIG. 4 is a cross-sectional view of the silicon carbide semiconductor device according to the first embodiment during manufacture.

Next, the $p^{+++}$-type contact region 8 is selectively formed in a surface layer of the $p^+$-type base layer 6 by photolithography and ion implantation of a p-type impurity. For example, a dose amount during the ion implantation for forming the $p^{+++}$-type contact region 8 may be set so that the impurity concentration becomes about $1\times10^{20}/cm^3$. The state up to here is depicted in FIG. 4.

Next, by photolithography and ion implantation of an n-type impurity, the $n^{++}$-type source region 7 is selectively formed in a surface layer of the $p^+$-type base layer 6 so as to contact the $p^{+++}$-type contact region 8. For example, a dose amount during the ion implantation for forming the $n^{++}$-type source region 7 may be so that the impurity concentration becomes about $1\times10^{20}/cm^3$. The sequence in which the $n^{++}$-type source region 7 and the $p^{+++}$-type contact region 8 are formed may be interchanged.

Figure 5:
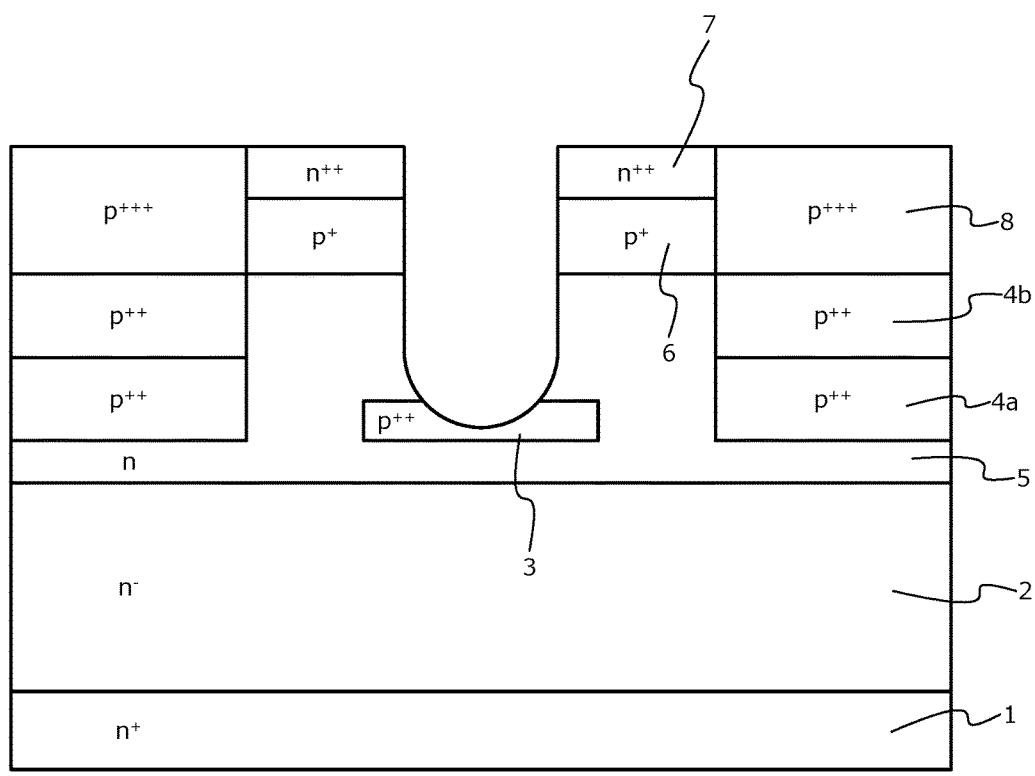
FIG. 5 is a cross-sectional view of the silicon carbide semiconductor device according to the first embodiment during manufacture.

Next, by photolithography and etching, the trench 18 is formed to penetrate the $n^{++}$-type source region 7 and the $p^+$-type base layer 6, and reach the n-type region 5 and the lower second $p^{++}$-type region 4a. An oxide film may be used as a mask in the formation of the trench. The state up to here is depicted in FIG. 5.

Figure 6:
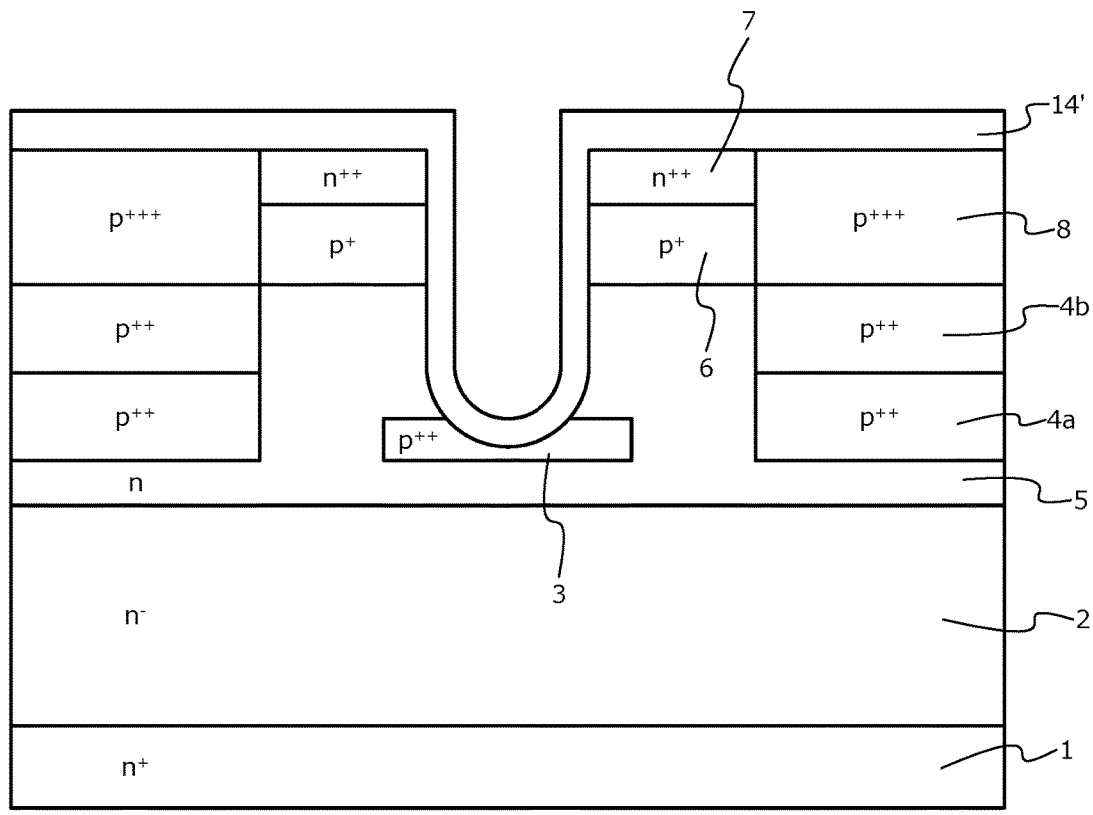
FIG. 6 is a cross-sectional view of the silicon carbide semiconductor device according to the first embodiment during manufacture.

Next, in the trench 18 and on the $n^{++}$-type source region 7 and the $p^+$-type base layer 6, a low-concentration thin film 14' that constitutes the low-concentration thin film 14 is formed to a thickness of 0.03 to 0.1 μm by epitaxial growth. Error of the thickness of the low-concentration thin film 14' is about ±10%. For example, conditions of the epitaxial growth for forming the low-concentration thin film 14' may be set so that the impurity concentration of the low-concentration thin film 14' becomes about $1\times10^{14}$ to $5\times10^{16}/cm^3$. Further, error of the concentration of the low-concentration thin film 14' is about ±100%. Here, the conductivity type of the low-concentration thin film 14' may be an n-type. The conductivity type of the low-concentration thin film 14' may be a p-type. Further, the low-concentration thin film 14' may be non-doped. The state up to here is depicted in FIG. 6.

After formation of the low-concentration thin film 14', isotropic etching to remove damage of the trench 18, hydrogen annealing to round corners of the opening and the bottom of the trench 18, etc. may be performed. Any one of the isotropic etching and the hydrogen annealing alone may be performed. Further, the isotropic etching may be performed followed by the hydrogen annealing. The hydrogen annealing is performed at a temperature of, for example, 1500 degrees C.

In a case where hydrogen annealing is performed, the low-concentration thin film 14' becomes the low-concentration thin film 14 by the hydrogen annealing. In other words, the low-concentration thin film 14 having conductivity types that are the same as those of the contacting regions is formed. In particular, in parts of the low-concentration thin film 14' in contact with the $n^{++}$-type source region 7, an n-type impurity, e.g., phosphorus (P), diffuses in a horizontal direction and a vertical direction from the $n^{++}$-type source region 7 whereby the conductivity type becomes an $n^-$-type. Here, the horizontal direction is the width direction of the trench 18 and the part into which the n-type impurity diffuses in the horizontal direction is a part of the low-concentration thin film 14' in the trench 18 and in contact with the $n^{++}$-type source region 7. Further, the vertical direction is the depth direction of the trench 18 and the part into which the n-type impurity diffuses in the vertical direction is a part of the low-concentration thin film 14' on top of the silicon carbide base 100 and in contact with the $n^{++}$-type source region 7. Similarly, in parts of the low-concentration thin film 14' in contact with the $p^+$-type base layer 6, a p-type impurity, e.g., aluminum (Al), diffuses in the horizontal direction from the $p^+$-type base layer 6 whereby the conductivity type becomes a $p^-$-type. Similarly, in parts of the low-concentration thin film 14' in contact with the p$^+$-type base layer 6, the n-type region 5, and the first p$^{++}$-type region 3, impurity diffusion occurs, establishing the conductivity type. Silicon carbide is a material into which impurities do not easily diffuse and therefore, an impurity that has diffused in the horizontal direction rarely further diffuses in the vertical direction. Therefore, the conductivity types of the low-concentration thin film 14 are the same as the respective conductivity types of the regions in contact with the low-concentration thin film 14.

Further, since an impurity of a p-type or an n-type diffuses into the low-concentration thin film 14 from a region in contact with the low-concentration thin film 14, the impurity concentration of the low-concentration thin film 14 is highest at the parts in contact with the n$^{++}$-type source region 7, the p$^+$-type base layer 6, etc. and correspondingly decreases with increasing distance from the n$^{++}$-type source region 7, the p$^+$-type base layer 6, etc. As a result, the low-concentration thin film 14 has profile in which the impurity concentration decreases with proximity to the center O of the trench 18.

Figure 7:
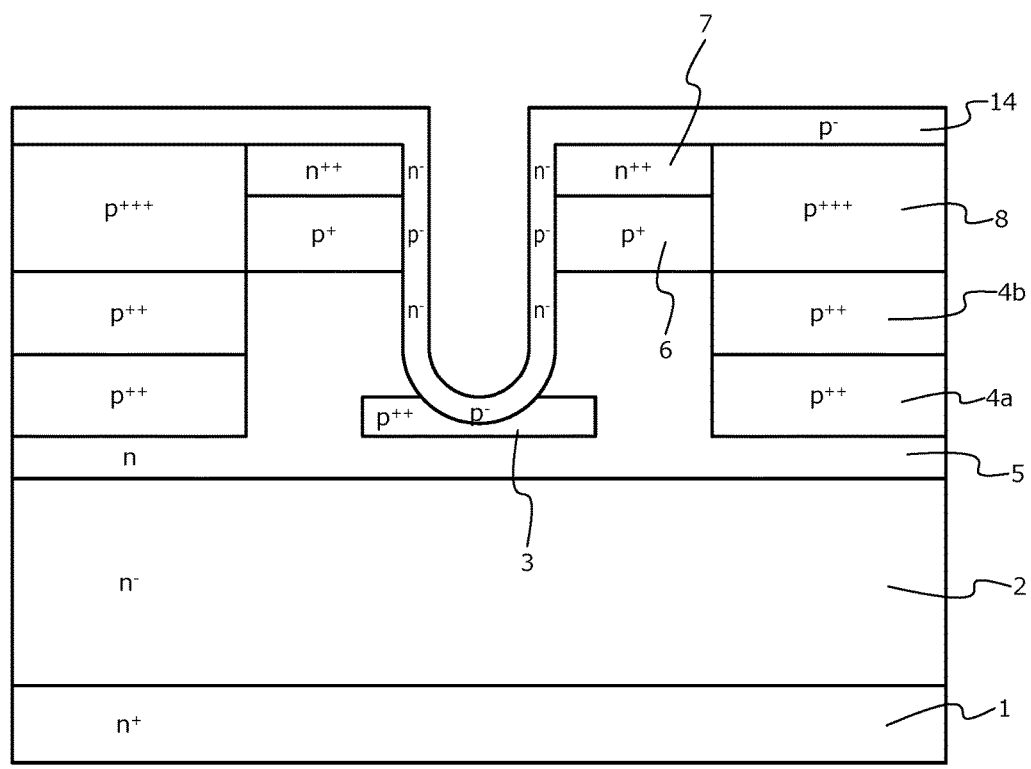
FIG. 7 is a cross-sectional view of the silicon carbide semiconductor device according to the first embodiment during manufacture.

Next, activation annealing is performed with respect to the ion implanted regions. For example, the activation annealing is performed at a temperature of 1700 degrees C. As a result, the impurity ion implanted in the n$^{++}$-type source region 7 and the p$^+$-type base layer 6 is activated. Here, in a case where hydrogen annealing for the trench 18 is not performed, the low-concentration thin film 14' becomes the low-concentration thin film 14 by the activation annealing. Details of the process are similar to those in a case of hydrogen annealing for the trench 18 and therefore, are not discussed herein. The state up to here is depicted in FIG. 7. Further, in some cases, the activation annealing may be performed before the trench 18 is formed. In this case, the hydrogen annealing for the trench 18 has to be performed to form the low-concentration thin film 14.

Figure 8:
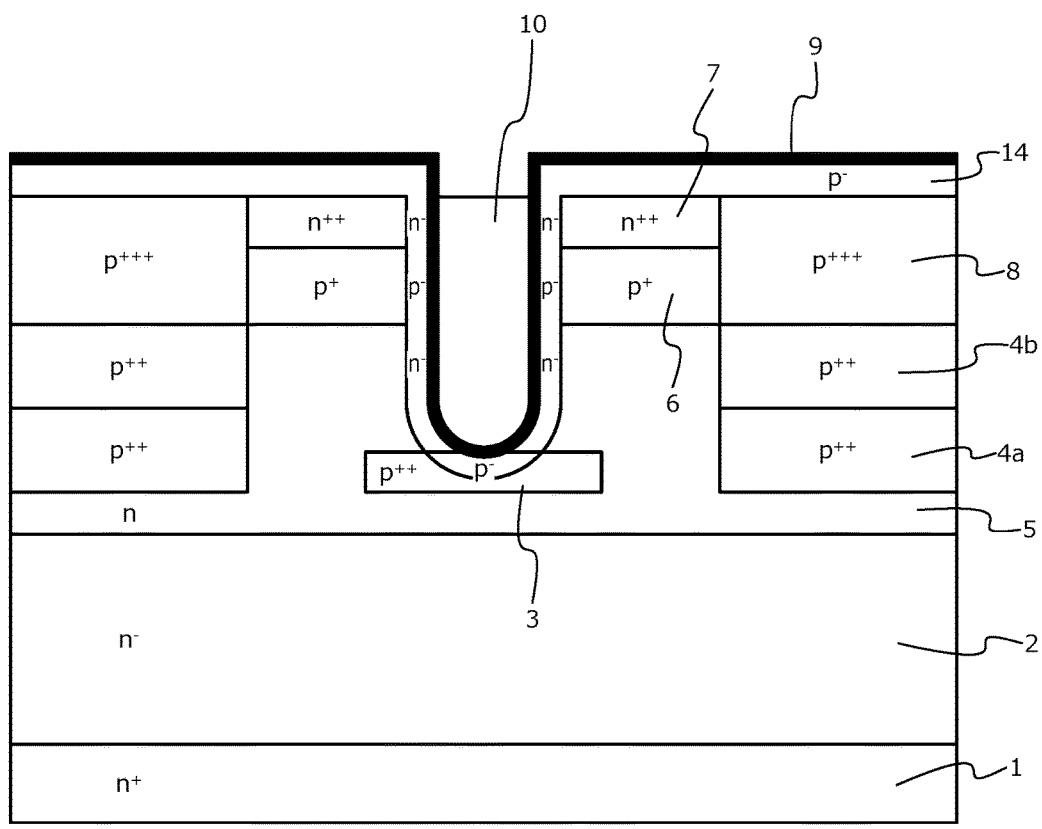
FIG. 8 is a cross-sectional view of the silicon carbide semiconductor device according to the first embodiment during manufacture.

Next, the gate insulating film 9 is formed along the front surface of the silicon carbide base 100 and the inner walls of the trench 18. Next, for example, a polysilicon is deposited so as to be embedded in the trench 18 and the polysilicon is etched, leaving the polysilicon in the trench 18 to become the gate electrode 10. Here, the polysilicon may be etched to remain deeper than a base surface part, or patterning and etching may be performed whereby the polysilicon protrudes out from the base surface part. The state up to here is depicted in FIG. 8.

Next, the interlayer insulating film 11 is formed on the entire front surface of the silicon carbide base 100 so as to cover the gate electrode 10. The interlayer insulating film 11 is formed using, for example, a none-doped silicate glass (NSG), a phosphosilicate glass (PSG), a borophosphosilicate glass (BPSG), a high temperature oxide (HTO), or any combination thereof. Next, the interlayer insulating film 11 and the gate insulating film 9 are patterned to form a contact hole, exposing the n$^{++}$-type source region 7 and the p$^{+++}$-type contact region 8.

Next, on the front surface side of the silicon carbide semiconductor base 100, a nickel (Ni) film is formed by, for example, sputtering. Next, silicon carbide semiconductor parts (the n$^{++}$-type source region 7 and the p$^{+++}$-type contact region 8) and the nickel film are caused to react by sintering (heat treatment), forming the nickel silicide film 15 whereby an ohmic contact is formed with the silicon carbide semiconductor parts. Between the interlayer insulating film 11 and the nickel film, a TiN (titanium nitride) film may be formed. In a process of forming the nickel silicide film 15, a p$^-$-type layer of the parts of the low-concentration thin film 14 in contact with the p$^{+++}$-type contact region 8 is lost and therefore, the low-concentration thin film 14 no longer affects the contact resistance.

Next, the source electrode 12 is formed so as to be in contact with the n$^{++}$-type source region 7. The source electrode 12 may be formed so as to cover the nickel silicide film 15, or may be left in only the contact hole.

Next, the source electrode pad is formed so as to be embedded in contact hole. A part of a metal layer deposited to form the source electrode pad may be used as the gate pad. On the rear surface of the n$^+$-type silicon carbide substrate 1, a metal film such as a nickel (Ni) film, a titanium (Ti) film, etc. is formed at a contact part of the drain electrode 13 by sputter deposition or the like. The metal film may be constituted by a stacked combination of the Ni film and the Ti film. Thereafter, annealing such as rapid thermal annealing (RTA) is performed so that the metal film is converted into a silicide thereby forming an ohmic contact. Subsequently, for example, a thick film such as a stacked film sequentially including a Ti film, a Ni film, and a gold (Au) is formed by, for example, electron beam (EB) deposition whereby the drain electrode 13 is formed.

In the described epitaxial growth and ion implantation, for example, arsenic (As), antimony (Sb), nitrogen (N) or phosphorus (P), etc. that are an n-type with respect to silicon carbide may be used as an n-type impurity (n-type dopant). Further, for example, gallium (Ga), indium (In), titanium (TI), boron (B) or aluminum (Al), etc. that are a p-type with respect to silicon carbide may be used as a p-type impurity (p-type dopant). In this manner, the MOSFET depicted in FIG. 1 is completed.

As described, according to the first embodiment, a low-concentration thin film is provided in the trench, the low-concentration thin film has a region that is in contact with the p$^+$-type base layer and that has an impurity concentration lower than that of the p$^+$-type base layer. As a result, the impurity concentration of the channel portion may be lowered. Therefore, when voltage is applied to the gate, the channel portion is completely depleted, enabling electric field entering from the drain side to be suppressed. As a result, even when the channel length is shortened, the threshold may be prevented from sharply decreasing due to short channel effects. Further, the channel length may be shortened while maintaining the threshold as is. Therefore, the tradeoff between the ON resistance and the threshold may be improved.

Further, the low-concentration thin film has a profile in which the impurity concentration decreases with proximity to the center of the trench whereby the impurity concentration of the channel portion may be further reduced. As a result, the channel length is further shortened, enabling the ON resistance to be reduced.

Further, the low-concentration thin film having the profile in which the impurity concentration decreases with proximity to the center of the trench, may be formed by an annealing process for the trench, or a process for activating the n$^{++}$-type source region and the p$^{+++}$-type contact region. As a result, the low-concentration thin film may be formed by an existing process whereby the semiconductor device that reduces the ON resistance may be realized with a low cost.

Figure 9:
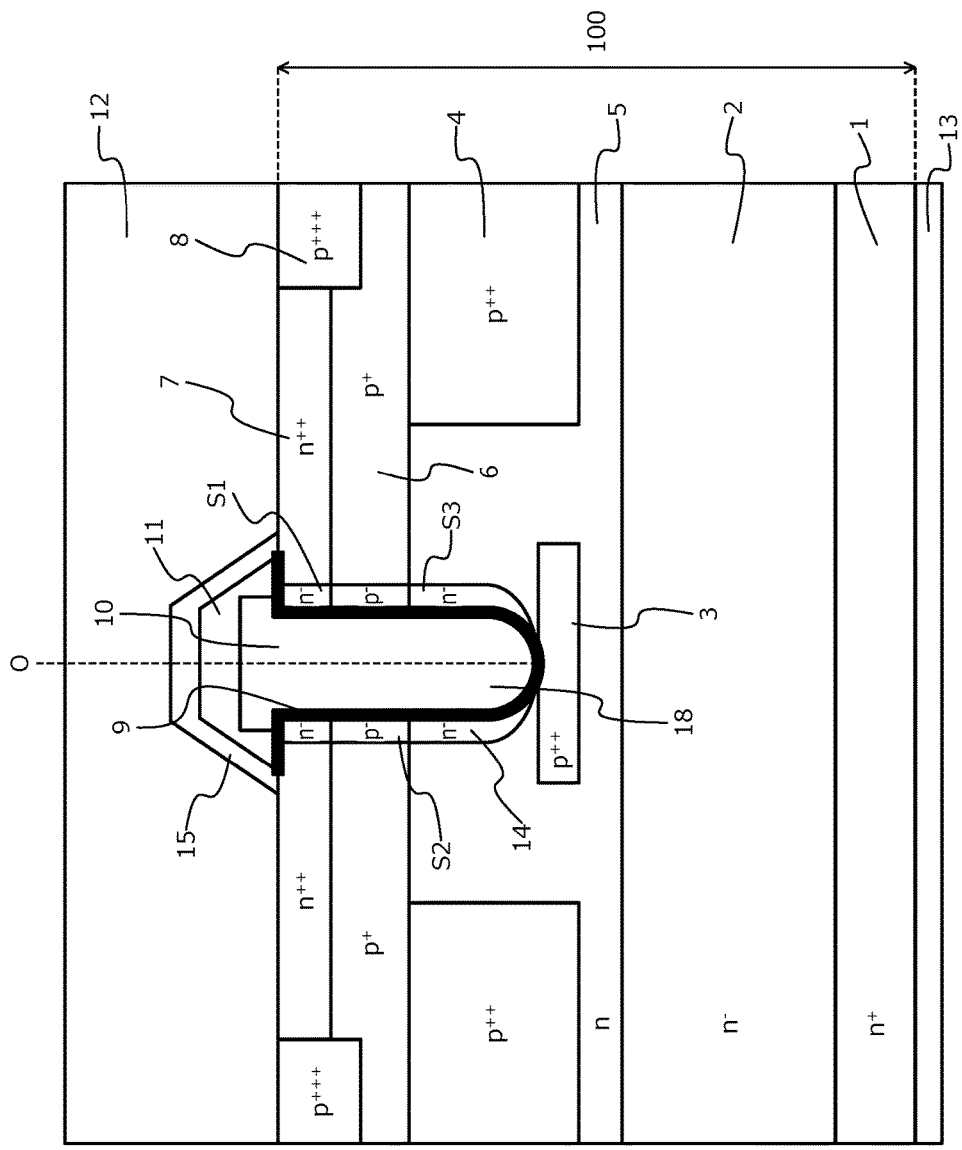
FIG. 9 is a cross-sectional view of a structure of the silicon carbide semiconductor device according to a second embodiment.

A structure of the silicon carbide semiconductor device according to the second embodiment will be described. FIG. 9 is a cross-sectional view of a structure of the silicon carbide semiconductor device according to the second embodiment. The silicon carbide semiconductor device according to the second embodiment differs from the silicon carbide semiconductor device according to the first embodiment in that, as depicted in FIG. 9, in the second embodiment, the low-concentration thin film 14 is not provided at the bottom of the trench 18.

The low-concentration thin film 14 is in contacted with the $n^{++}$-type source region 7, the $p^+$-type base layer 6, and the n-type region 5. Conductivity types of the low-concentration thin film 14 are the same as the respective conductivity types of the regions in contact with the low-concentration thin film 14. The impurity concentrations of the low-concentration thin film 14 are lower than those of the regions in contact with the low-concentration thin film 14. For example, the region S1 of the low-concentration thin film 14 in contact with the $n^{++}$-type source region 7 is an $n^-$-type and the impurity concentration of the region S1 is lower than that of the $n^{++}$-type source region 7. Further, the region S2 of the low-concentration thin film 14 in contact with the $p^+$-type base layer 6 is a $p^-$-type and the impurity concentration of the region S2 is lower than that of the $p^+$-type base layer 6. The region S3 of the low-concentration thin film 14 in contact with the n-type region 5 is an $n^-$-type and the impurity concentration of the region S3 is lower than that of the n-type region 5. Further, the low-concentration thin film 14 is not in contact with the first $p^{++}$-type region 3. In other words, the low-concentration thin film 14 is not provided at the bottom of the trench 18. At the bottom of the trench 18, the trench 18 and the first $p^{++}$-type region 3 are in contact with each other. As a result, capacitance between the drift and the gate decreases, enabling loss at the time of switching to be reduced. Further, the film thickness of the low-concentration thin film 14 is such that the aspect ratio of the channel length and the film thickness of the low-concentration thin film 14 is 2 or more. For example, when the channel length is 0.4 μm, the film thickness of the low-concentration thin film 14 may be set to 0.2 μm or less, and the channel length/the film thickness of the low-concentration thin film 14 may be set to be ≥2.

The low-concentration thin film 14 has a profile in which the impurity concentration decreases with proximity to a center O of the trench 18. In particular, the impurity concentration of the low-concentration thin film 14 is highest at the regions thereof respectively in contact with the $n^{++}$-type source region 7, the $p^+$-type base layer 6, and the n-type region 5; and the impurity concentration at a region of the low-concentration thin film 14 in contact with the gate insulating film 9 (described hereinafter) is lowest. Because the impurity concentration is highest at the region in contact with $p^+$-type base layer 6, the low-concentration thin film 14 may further increase the channel region resistance.

Further, as depicted in FIG. 9, in the second embodiment, the $p^{+++}$-type contact region 8 needs not be in contact with the second $p^{++}$-type region 4.

The method of manufacturing a silicon carbide semiconductor device according to the second embodiment will be described. FIGS. 10, 11, 12, 13, 14, and 15 are cross-sectional views of the silicon carbide semiconductor device according to the second embodiment during manufacture. First, similar to the first embodiment, processes of preparing the $n^+$-type silicon carbide substrate 1 to selectively forming the upper second $p^{++}$-type region 4b are sequentially performed (refer to FIGS. 2 and 3).

Next, on the upper n-type region 5b and the upper second $p^{++}$-type region 4b, the $p^+$-type base layer 6 is formed by epitaxial growth. For example, conditions of the epitaxial growth for forming the $p^+$-type base layer 6 may be set so that the impurity concentration of the $p^+$-type base layer 6 becomes about $1.7\times10^{17}/cm^3$. Further, the conductivity type of the upper n-type region 5b may be inverted by ion implantation of a p-type impurity to thereby form the $p^+$-type base layer 6.

Figure 10:
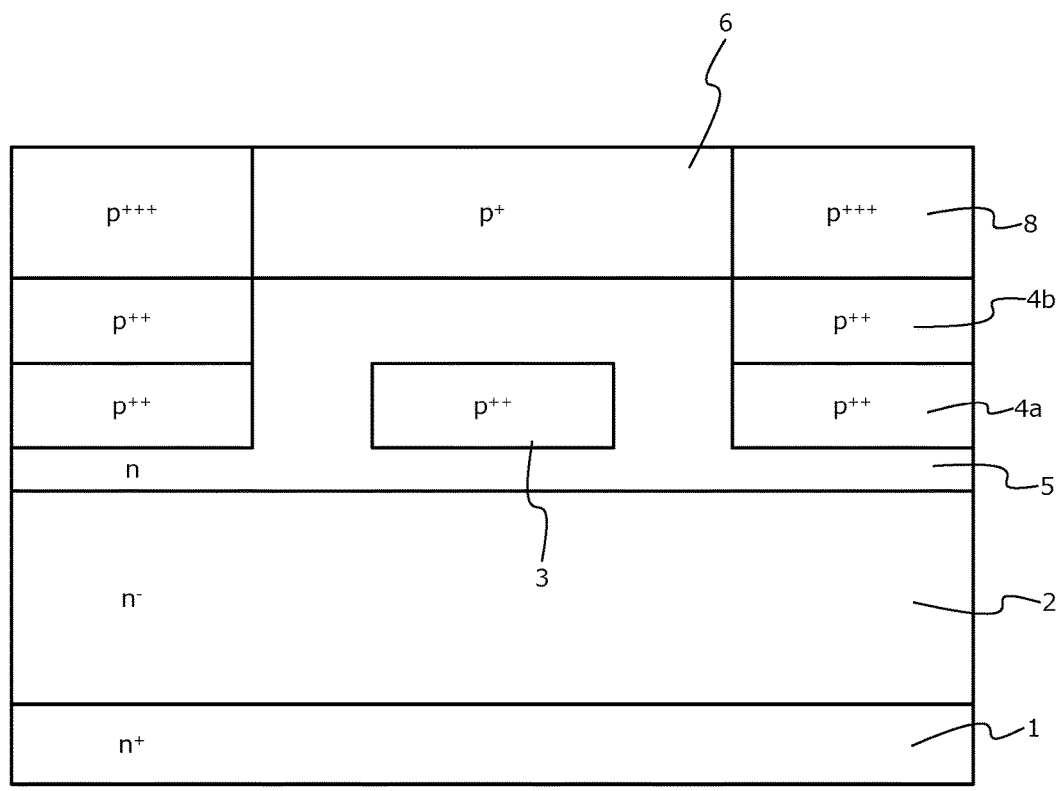
FIG. 10 is a cross-sectional view of the silicon carbide semiconductor device according to the second embodiment during manufacture.

Next, the $p^{+++}$-type contact region 8 is selectively formed in the surface layer of the $p^+$-type base layer 6 by photolithography and ion implantation of a p-type impurity, so as not to be in contact with the second $p^{++}$-type region 4. For example, a dose amount during the ion implantation for forming the $p^{+++}$-type contact region 8 may be set so that the impurity concentration becomes about $3\times10^{20}/cm^3$. The state up to here is depicted in FIG. 10.

Next, the $n^{++}$-type source region 7 is selectively formed in the surface of the $p^+$-type base layer 6 by photolithography and ion implantation of an n-type impurity so as to be in contact with the $p^{+++}$-type contact region 8. For example, a dose amount during the ion implantation for forming the $n^{++}$-type source region 7 may be set so that the impurity concentration becomes about $3\times10^{20}/cm^3$. The sequence in which the $n^{++}$-type source region 7 and the $p^{+++}$-type contact region 8 are formed may be interchanged.

Figure 11:
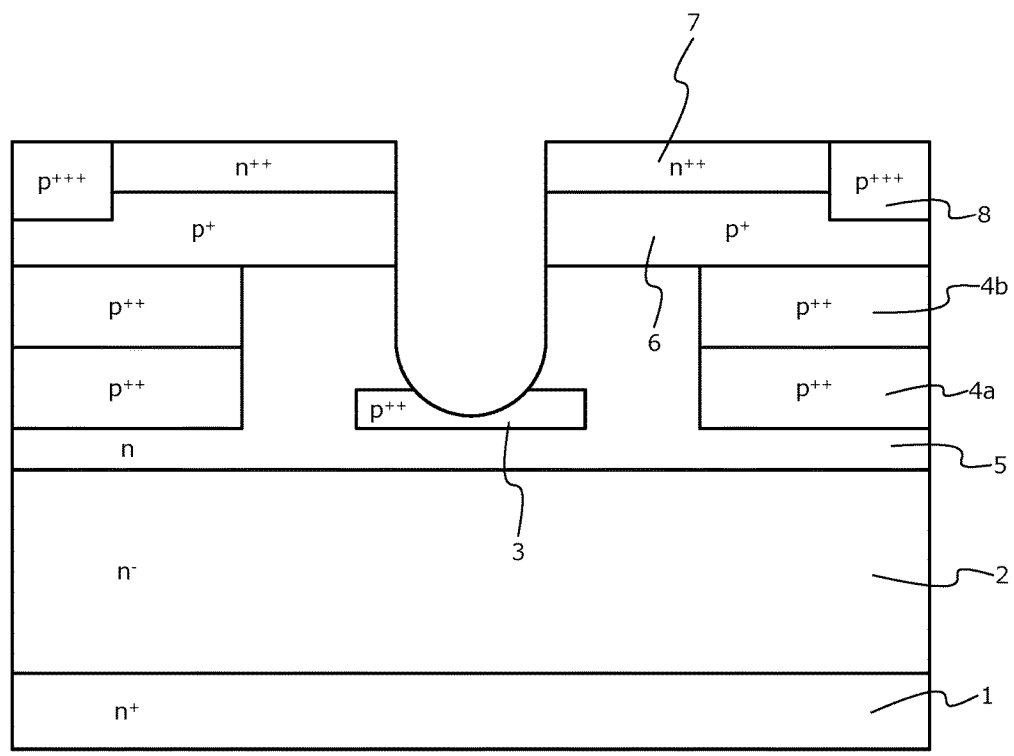
FIG. 11 is a cross-sectional view of the silicon carbide semiconductor device according to the second embodiment during manufacture.

Next, by photolithography and etching, the trench 18 is formed to penetrate the $n^{++}$-type source region 7 and the $p^+$-type base layer 6, and reach the n-type region 5 and the lower second $p^+$-type region 4a. An oxide film may be used as a mask in the formation of the trench 18. The state up to here is depicted in FIG. 11.

Figure 12:
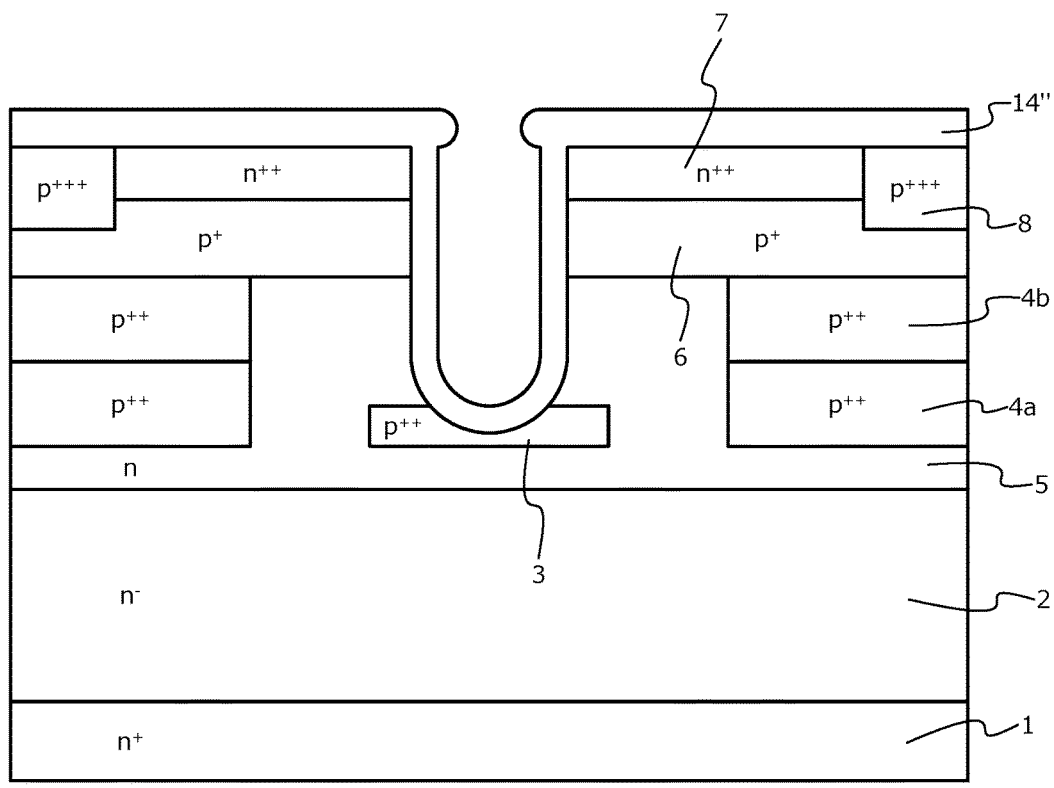
FIG. 12 is a cross-sectional view of the silicon carbide semiconductor device according to the second embodiment during manufacture.

Next, on the $n^{++}$-type source region 7, on the $p^{+++}$-type contact region 8, and in the trench 18, a low-concentration thin film 14" that constitutes the low-concentration thin film 14 is formed to a thickness of 0.1 μm by epitaxial growth. By this epitaxial growth, the low-concentration thin film 14" is thickly deposited on the $n^{++}$-type source region 7, on the $p^{+++}$-type contact region 8, and at the bottom, side walls and a top of the trench 18. The top of the trench 18 is a part on the source side from the region in contact with the trench 18 and the $n^{++}$-type source region 7. Further, the side walls of the trench 18 are parts in contact with the $n^{++}$-type source region 7, the $p^+$-type base layer 6, and the n-type region 5. As depicted in FIG. 12, at the top of the trench 18, the low-concentration thin film 14" is deposited to be particularly thick so as to cover the opening of the trench 18.

For example, conditions of the epitaxial growth for forming the low-concentration thin film 14" may be set so that the impurity concentration of the low-concentration thin film 14" becomes about $1\times10^{14}$ to $5\times10^{16}/cm^3$. Further, error of the concentration the low-concentration thin film 14" is about ±100%. Here, the conductivity type of the low-concentration thin film 14" may be an n-type. The conductivity type of the low-concentration thin film 14' may be a p-type. Further, the low-concentration thin film 14" may be non-doped. The state up to here is depicted in FIG. 12.

In particular, when the low-concentration thin film 14" is not doped and formed by epitaxial growth, the silicon carbide base 100 is placed in epitaxial growth equipment; the temperature of the silicon carbide base 100 is brought to a predetermined temperature within a range from 1500 to 1700 degrees C.; propane ($C_3H_8$) gas and silane ($SiH_4$) gas (source gas) are concurrently supplied using hydrogen ($H_2$) gas as a carrier gas; the gas pressure is controlled to a predetermined pressure within a range of 5000 Pa to 20000 Pa; and a growth period corresponding to a predetermined set film thickness is set whereby an epitaxial layer is formed on the surface of the silicon carbide base 100. The flowrate of the $H_2$ gas is, for example, 50 to 200 standard liters per minute (slm). The flowrate of the $SiH_4$ gas is, for example, 10 to 100 standard cubic centimeters per minute (sccm). The flowrate of the $C_3H_8$ gas is, for example, 10 to 100 sccm.

Further, when the low-concentration thin film 14″ is an n-type and formed by epitaxial growth, the silicon carbide base 100 is placed in the epitaxial growth equipment; the temperature of the silicon carbide base 100 is brought to a predetermined temperature within a range from 1500 to 1700 degrees C.; using hydrogen ($H_2$) gas as a carrier gas, propane ($C_3H_8$) gas and silane ($SiH_4$) gas (source gas) are concurrently supplied with a dopant gas containing nitrogen ($N_2$); the gas pressure is controlled to a predetermined pressure within a range of 5000 Pa to 20000 Pa; and a growth period corresponding to a predetermined set film thickness is set whereby an epitaxial layer is formed on the surface of the silicon carbide base 100. The flowrate of $H_2$ gas is, for example, 50 to 200 slm; and the flowrate of the $SiH_4$ gas is, for example, 10 to 100 sccm. The flowrate of the $C_3H_8$ gas is, for example, 10 to 100 sccm; and the flowrate of the $N_2$ gas is, for example, 1 to 20 sccm.

When the low-concentration thin film 14″ is a p-type formed by epitaxial growth, the silicon carbide base 100 is place in the epitaxial growth equipment; the temperature of the silicon carbide base 100 is brought to a predetermined temperature within a range of 1500 to 1700 degrees C.; using hydrogen ($H_2$) gas as a carrier gas, propane ($C_3H_8$) gas and silane ($SiH_4$) gas (source gas) are concurrently supplied with a dopant gas including trimethylaluminium (TMA: $(CH_3)_3Al$); the gas pressure is controlled to a predetermined pressure within a range of 5000 Pa to 20000 Pa; and a growth period corresponding to a predetermined set film thickness is set whereby an epitaxial layer is formed on the surface of the silicon carbide base 100. The flowrate of the $H_2$ gas is, for example, 50 to 200 slm; and the flowrate of the $SiH_4$ gas is, for example, 10 to 100 sccm. The flowrate of the $C_3H_8$ gas is, for example, 10 to 100 sccm; and the flowrate of the TMA gas is, for example, 0.01 to 0.5 sccm.

Figure 13:
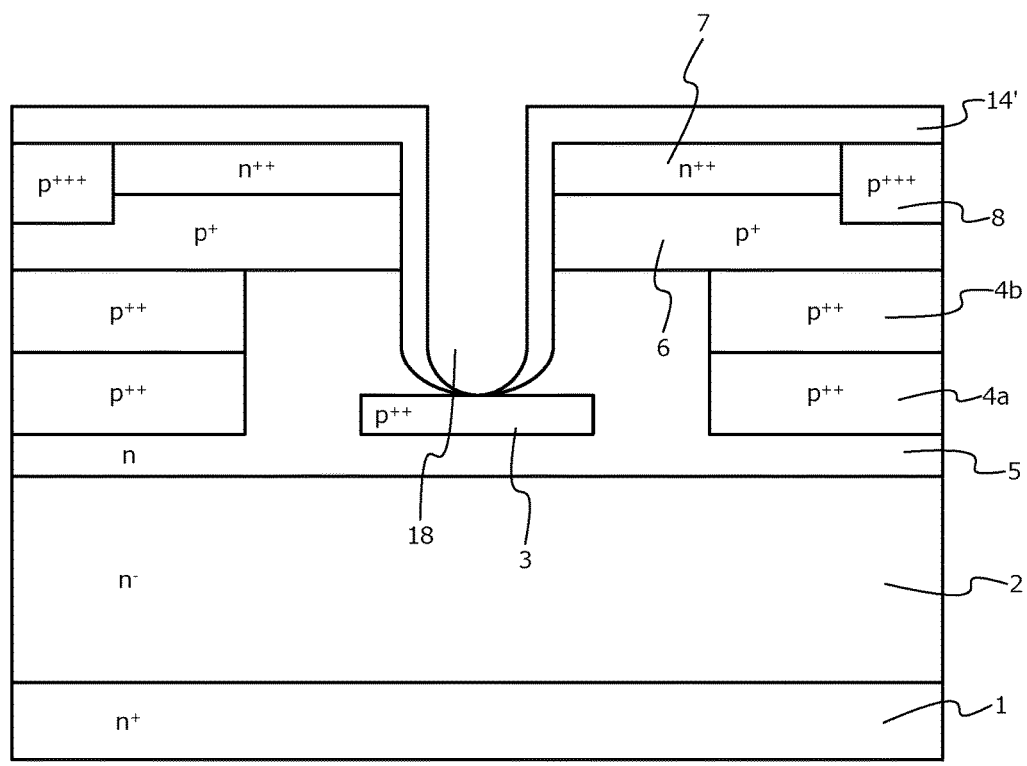
FIG. 13 is a cross-sectional view of the silicon carbide semiconductor device according to the second embodiment during manufacture.

Next, etchback is performed and the low-concentration thin film 14″ at the top and the bottom of the trench 18 is removed, forming the low-concentration thin film 14′. In particular, parts of the low-concentration thin film 14″ on the $n^{++}$-type source region 7, on the $p^{+++}$-type contact region 8, and parts at the side walls of the trench 18 are partially removed whereby the thicknesses of the removed parts become 0.03 to 0.1 μm, and anisotropic etching is performed until the part of the low-concentration thin film 14″ at the bottom of the trench 18 is removed. In this manner, on the $n^{++}$-type source region 7, on the $p^{+++}$-type contact region 8, and in the trench 18, the film thickness may be formed to a thickness of 0.03 to 0.1 μm. While control of the period, the flowrate, the pressure, etc. to achieve a thin film thickness by epitaxial growth is difficult, herein, a thick film is formed and thinned by etching whereby a thin film may be easily created. The state up to here is depicted in FIG. 13.

In particular, with etchback of the low-concentration thin film 14″, the silicon carbide base 100 is placed in inductively coupled plasma (ICP) etching equipment that adopts an ICP scheme; a mixed gas of oxygen ($O_2$), argon (Ar), and sulfur hexafluoride ($SF_6$) gas (etching gas) is used; an antenna power is set to be 1000 to 2000 W; a bias power is set to be 100 to 500 W; the gas pressure is controlled to a predetermined pressure within a range of 0.1 to 2.0 Pa; and an etching period corresponding to a predetermined set film thickness is set whereby etchback of the surface of the silicon carbide base 100 is performed. The flowrate of the $SF_6$ gas is, for example, 1 to 50 sccm; and the flowrate of the $O_2$ gas is, for example, 1 to 50 sccm. The flowrate of the Ar gas is, for example, 50 to 300 sccm.

After formation of the low-concentration thin film 14′, isotropic etching to remove damage of the trench 18, hydrogen annealing to round the corners of the opening and the bottom of the trench 18, etc. may be performed. Any one of the isotropic etching and the hydrogen annealing alone may be performed. Further, the isotropic etching may be performed followed by the hydrogen annealing. The hydrogen annealing is performed at a temperature of, for example, 1500 degrees C.

In a case where hydrogen annealing is performed, the low-concentration thin film 14′ becomes the low-concentration thin film 14 by the hydrogen annealing. In other words, the low-concentration thin film 14 having conductivity types that are the same as those of the contacting regions is formed. In particular, in parts of the low-concentration thin film 14′ in contact with the $n^{++}$-type source region 7, an n-type impurity, e.g., phosphorus (P), diffuses in a horizontal direction and a vertical direction from the $n^{++}$-type source region 7 whereby the conductivity type becomes an $n^-$-type. Here, the horizontal direction is the width direction of the trench 18 and the part into which the n-type impurity diffuses in the horizontal direction is a part of the low-concentration thin film 14′ in the trench 18 and in contact with the $n^{++}$-type source region 7. Further, the vertical direction is the depth direction of the trench 18 and the part into which the n-type impurity diffuses in the vertical direction is a part of the low-concentration thin film 14′ on top of the silicon carbide base 100 and in contact with the $n^{++}$-type source region 7. Similarly, in parts of the low-concentration thin film 14′ in contact with the $p^+$-type base layer 6, a p-type impurity, e.g., aluminum (Al), diffuses in the horizontal direction from the $p^+$-type base layer 6 whereby the conductivity type becomes a $p^-$-type. Similarly, in parts of the low-concentration thin film 14′ in contact with the $p^+$-type base layer 6 and the n-type region 5, impurity diffusion occurs, establishing the conductivity type. Silicon carbide is a material into which impurities do not easily diffuse and therefore, an impurity that has diffused in the horizontal direction rarely further diffuses in the vertical direction. Therefore, the conductivity types of the low-concentration thin film 14 are the same as the respective conductivity types of the regions in contact with the low-concentration thin film 14.

Further, since an impurity of a p-type or an n-type diffuses into the low-concentration thin film 14 from a region in contact with the low-concentration thin film 14, the impurity concentration of the low-concentration thin film 14 is highest at the parts in contact with the $n^{++}$-type source region 7, the $p^+$-type base layer 6, etc. and correspondingly decreases with increasing distance from the $n^{++}$-type source region 7, the $p^+$-type base layer 6, etc. As a result, the low-concentration thin film 14 has profile in which the impurity concentration decreases with proximity to the center O of the trench 18.

Figure 14:
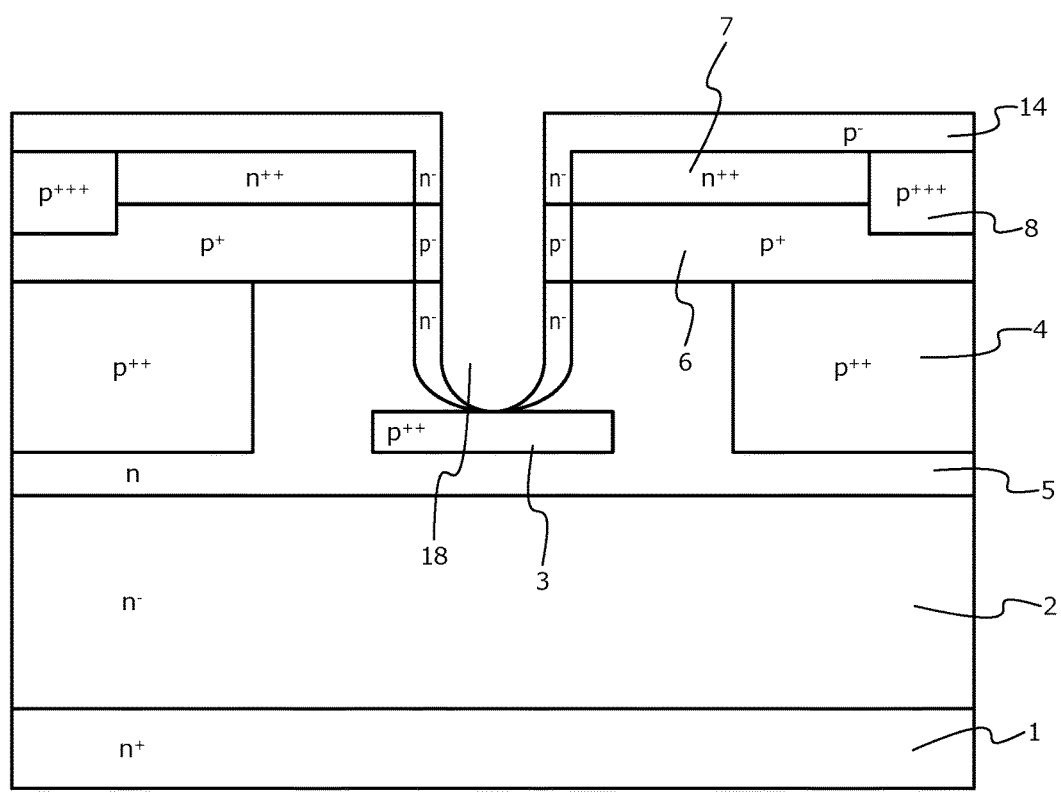
FIG. 14 is a cross-sectional view of the silicon carbide semiconductor device according to the second embodiment during manufacture.

Next, activation annealing is performed with respect to the ion implanted regions. For example, the activation annealing is performed at a temperature of 1700 degrees C. As a result, the impurity ion implanted in the $n^{++}$-type source region 7 and the $p^{+++}$-type contact region 8 is activated. Here, in a case where hydrogen annealing for the trench 18 is not performed, the low-concentration thin film 14′ becomes the low-concentration thin film 14 by the activation annealing. Details of the process are similar to those in a case of hydrogen annealing for the trench 18 and therefore, are not discussed herein. The state up to here is depicted in FIG. 14. Further, in some cases, the activation annealing may be performed before the trench 18 is formed. In this case, the hydrogen annealing for the trench 18 has to be performed to form the low-concentration thin film 14.

Figure 15:
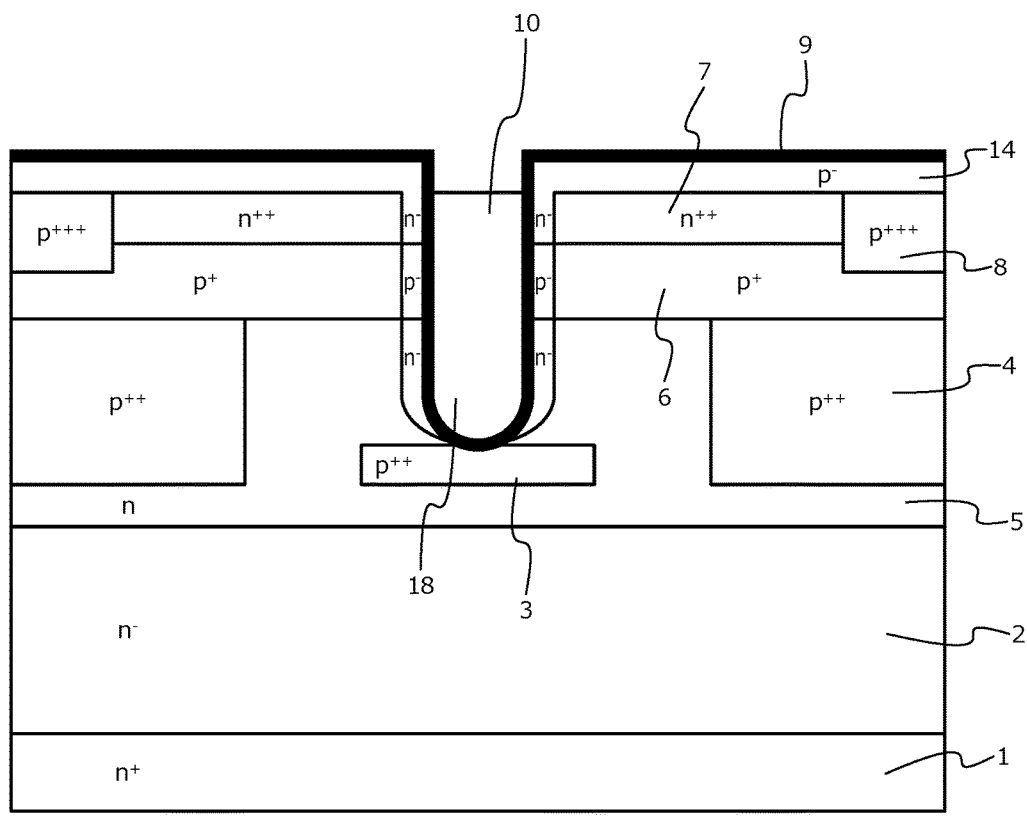
FIG. 15 is a cross-sectional view of the silicon carbide semiconductor device according to the second embodiment during manufacture.

Next, the gate insulating film 9 is formed along the front surface of the silicon carbide base 100 and the inner walls of the trench 18. Next, for example, a polysilicon is deposited so as to be embedded in the trench 18 and the polysilicon is etched, leaving the polysilicon in the trench 18 to become the gate electrode 10. Here, the polysilicon may be etched to remain deeper than a base surface part, or patterning and etching may be performed whereby the polysilicon protrudes from the base surface part. The state up to here is depicted in FIG. 15.

Next, similar to the first embodiment, processes from forming the interlayer insulating film 11 to forming the drain electrode 13 are performed. In this manner, the MOSFET depicted in FIG. 9 is completed.

As described, according to the second embodiment, effects similar to those of the first embodiment may be obtained. Further, in the second embodiment, the low-concentration thin film is not provided at the bottom of the trench whereby capacitance between the drift region and the gate is reduced, enabling loss at the time of switching to be decreased. As a result, a semiconductor device may be realized that during operation, generates less heat and has low power loss.

Further, in the formation of the low-concentration thin film by epitaxial growth, while control of the period, the flowrate, the pressure, etc. is difficult, in the second embodiment, a thick film is formed and thinned by etching whereby the low-concentration thin film may be easily created.

Figure 16:
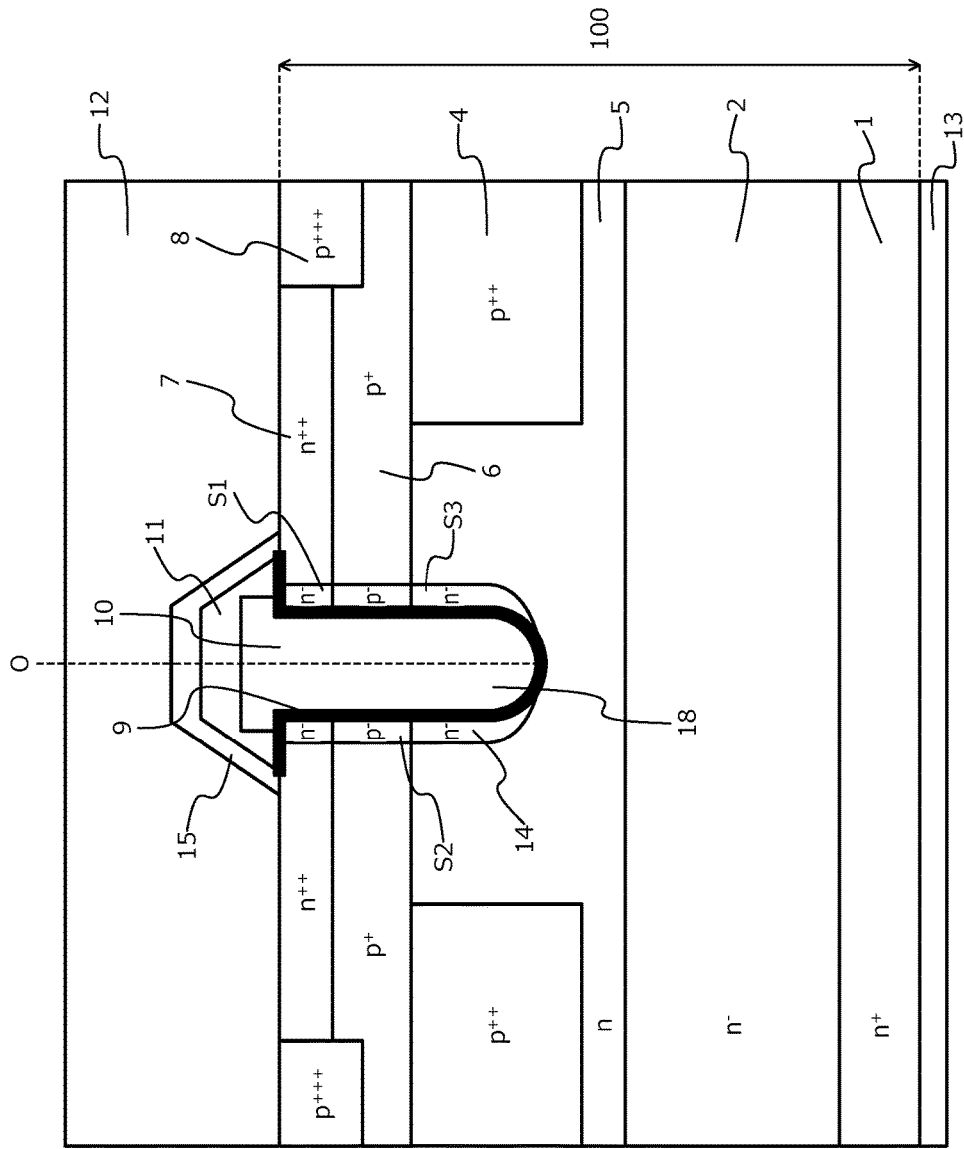
FIG. 16 is a cross-sectional view of the silicon carbide semiconductor device according to a third embodiment.
Figure 17:
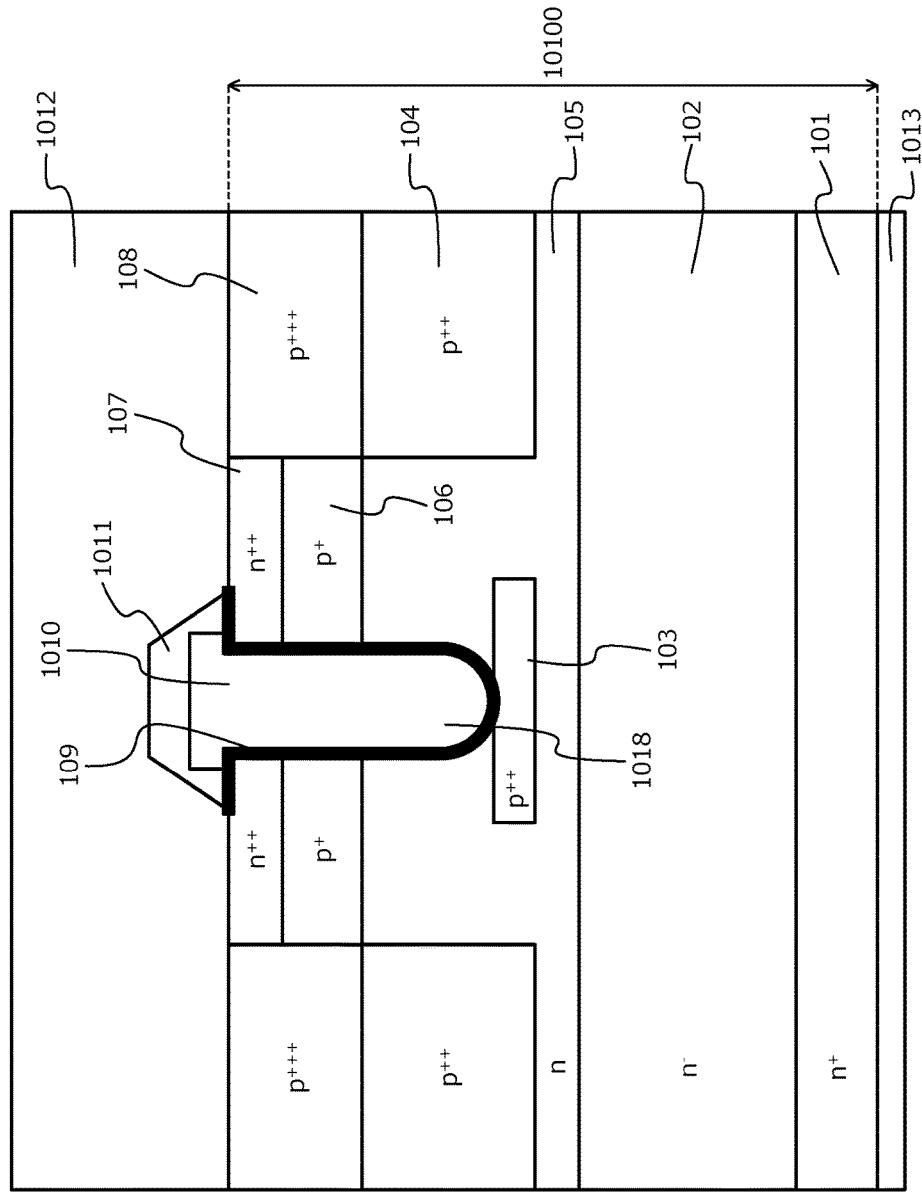
FIG. 17 is a cross-sectional view of a structure of a conventional silicon carbide semiconductor device.

A structure of the silicon carbide semiconductor device according to a third embodiment will be described. FIG. 16 is a cross-sectional view of the silicon carbide semiconductor device according to the third embodiment. The silicon carbide semiconductor device according to the third embodiment differs from the silicon carbide semiconductor device according to the second embodiment in that, as depicted in FIG. 16, in the third embodiment, the first $p^{++}$-type region 3 in contact with the trench 18 is not provided.

Here, when the first $p^{++}$-type region 3 is present, the low-concentration thin film 14 is not at the bottom of the trench 18 and therefore, the n-type impurity penetrates the first $p^{++}$-type region 3 whereby the first $p^{++}$-type region 3 becomes a resistor and the ON resistance increases. On the other hand, in the third embodiment, since the first $p^{++}$-type region 3 is not provided, no region acting as a resistor is present whereby the ON resistance is further reduced compared to the second embodiment. Due to the absence of the first $p^{++}$-type region 3, electric field concentrates at the bottom of the trench 18. However, for example, the interlayer insulating film 11 is made thick or the distance between the trench 18 and the second $p^{++}$-type region 4 is shortened whereby the concentration of electric field at the bottom of the trench 18 may be mitigated.

The method of manufacturing a silicon carbide semiconductor device according to the third embodiment will be described. First, similar to the first embodiment, processes of preparing the $n^+$-type silicon carbide substrate 1 to forming the lower n-type region 5a by epitaxial growth are sequentially performed (refer to FIG. 2).

Next, by photolithography and ion implantation of a p-type impurity, the lower second $p^{++}$-type region 4a is selectively formed in the surface layer of the lower n-type region 5a. In other words, the first $p^{++}$-type region 3 is not formed in the surface of the lower n-type region 5a. The present structure differs from FIG. 3 of the first embodiment in that the first $p^{++}$-type region 3 is not provided and therefore, the structure during manufacture is not depicted. Subsequently, similar to the second embodiment, the process of forming the upper n-type region 5b by epitaxial growth and subsequent processes are sequentially performed whereby the MOSFET depicted in FIG. 16 is completed.

As described, according to the third embodiment, effects similar to those of the second embodiment may be obtained. Furthermore, in the third embodiment, the first $p^{++}$-type region in contact with the bottom of the trench is not provided. As a result, no region that becomes a resistor due to an n-type impurity penetrating the region is present. As a result, the ON resistance may be further decreased as compared to the second embodiment.

In a practical example, the silicon carbide base 100 was placed in the epitaxial growth equipment; the temperature of the silicon carbide base 100 was brought to 1630 degrees C.; using $H_2$ gas as a carrier gas, $C_3H_8$ gas and $SiH_4$ gas (source gas) were concurrently supplied with a dopant gas containing $N_2$; the gas pressure was controlled to a pressure of 10000 Pa; and the low-concentration thin film 14" of an n-type was formed on the surface of the silicon carbide base 100. The flowrate of the $H_2$ was 100 slm; and the flowrate of the $SiH_4$ gas was 50 sccm. The flowrate of the $C_3H_8$ gas was 20 sccm; and the flowrate of the $N_2$ was 3 sccm.

Next, the silicon carbide base 100 was placed in the ICP etching equipment; a mixed gas of $O_2$, Ar, and $SF_6$ gas (etching gas) was used; the antenna power was set to be 1700 W; the bias power was set to be 210 W; the gas pressure was controlled to 0.8 Pa; and the surface of the silicon carbide base 100 was etchbacked. The flowrate of the $SF_6$ gas was set to be 10 sccm; and the flowrate of the $O_2$ gas was set to be 15 sccm. The flowrate of the Ar was set to be 140 sccm.

In this manner, a silicon carbide semiconductor device was produced and the channel length was shortened whereby it was confirmed that the ON resistance decreased. It was further confirmed that decreases in the threshold voltage did not occur. In addition, it was confirmed that loss at the time of switching was reduced and power loss during operation decreased.

In the embodiments, various modifications are possible within a scope not deviating from the spirit of the invention. For example, dimensions, impurity concentrations, etc. of regions may be variously set according to required specifications. Further, in the embodiments, while a MOSFET has been described as an example, without limitation hereto, the present invention is further applicable to various silicon carbide semiconductor devices that conduct and interrupt current under gate driving control based on a predetermined gate threshold voltage. An insulated gate bipolar transistor (IGBT) may be given as example of a silicon carbide semiconductor device under gate driving control. Further, in the embodiments, while a case in which silicon carbide is used as a wide bandgap semiconductor material has been described as an example, another wide bandgap semiconductor material other than silicon carbide, for example, gallium nitride (GaN), etc. may be adopted. Further, in the embodiments, while the first conductivity type is assumed to be an n-type and the second conductivity type is assumed to a p-type, the present invention is similarly implemented when the first conductivity type is a p-type and the second conductivity type is an n-type.

According to the embodiments, a low-concentration thin film (semiconductor film) having an impurity concentration lower than that of the $p^+$-type base layer is provided in the trench, at a region in contact with the $p^+$-type base layer (second semiconductor layer of the second conductivity type), whereby the impurity concentration of the channel portion may be lowered. As a result, when voltage is applied to the gate, the channel portion is completely depleted, enabling electric field entering from the drain side to be suppressed. As a result, even when the channel length is shortened, the threshold may be prevented from sharply decreasing due to short channel effects. Further, the channel length may be shortened while maintaining the threshold as is. Therefore, the tradeoff between the ON resistance and the threshold may be improved.

In the formation of the low-concentration thin film by epitaxial growth, while control of the period, the flowrate, the pressure, etc. is difficult, in the embodiments, a thick film is formed and thinned by etching whereby the low-concentration thin film may be easily created.

The silicon carbide semiconductor device and the method of manufacturing a silicon carbide semiconductor device according to the embodiments achieve an effect in that even when the channel length is shortened and the ON resistance is lowered, decreases in the threshold voltage do not occur.

As described, the silicon carbide semiconductor device and the method of manufacturing a silicon carbide semiconductor device according to the embodiments are useful for power semiconductor devices used in power converting equipment and power supply devices such as in various industrial machines, and are particularly suitable for silicon carbide semiconductor devices of a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide substrate;
a first semiconductor layer of a first conductivity type provided on a front surface of the silicon carbide substrate;
a second semiconductor layer of a second conductivity type provided on a first side of the first semiconductor layer, opposite to a second side of the first semiconductor layer facing the silicon carbide substrate;
a first semiconductor region of the first conductivity type that is selectively provided in the second semiconductor layer, and that has an impurity concentration that is higher than that of the second semiconductor layer;
a trench that penetrates the first semiconductor region and the second semiconductor layer, and that reaches the first semiconductor layer;
a semiconductor film that is provided in the trench, and that is in contact with the second semiconductor layer and the first semiconductor layer;
a gate electrode provided on the semiconductor film in the trench, via a gate insulating film;
a first electrode in contact with the first semiconductor region and the second semiconductor layer; and
a second electrode provided on a rear surface of the silicon carbide substrate,
wherein the semiconductor film has a region thereof that is in contact with the second semiconductor layer, that is a region of the second conductivity type, and that has an impurity concentration that is lower than that of the second semiconductor layer, and
wherein the semiconductor film has a profile in which the impurity concentration continuously decreases with proximity to a center of the trench.

2. The silicon carbide semiconductor device according to claim 1, wherein the region of the semiconductor film in contact with the second semiconductor layer is formed so as not to be provided at a bottom of the trench.

3. A method of manufacturing a silicon carbide semiconductor device, the method comprising:
providing a silicon carbide substrate;
forming a first semiconductor layer of a first conductivity type on a front surface of the silicon carbide substrate;
forming a second semiconductor layer of a second conductivity type on a first side of the first semiconductor layer, opposite a second side of the first semiconductor layer facing the silicon carbide substrate;
selectively forming a first semiconductor region of the first conductivity type in the second semiconductor layer, the first semiconductor region having an impurity concentration that is higher than that of the second semiconductor layer;
forming a trench that penetrates the first semiconductor region and the second semiconductor layer, and that reaches the first semiconductor layer;
forming a semiconductor film in the trench, the semiconductor film being in contact with the second semiconductor layer and the first semiconductor layer;
forming a gate electrode on the semiconductor film in the trench, via a gate insulating film;
forming a first electrode in contact with the first semiconductor region and the second semiconductor layer; and
forming a second electrode on a rear surface of the silicon carbide substrate,
wherein in forming the semiconductor film, a region of the semiconductor film in contact with the second semiconductor layer is formed to be of the second conductivity type and have an impurity concentration that is lower than that of the second semiconductor layer, and
wherein the semiconductor film is formed to have a profile in which the impurity concentration continuously decreases with proximity to a center of the trench, by an annealing process for the trench.

4. The method according to claim 3, wherein forming the semiconductor film includes:
forming the semiconductor film on the first semiconductor region, on the second semiconductor layer, and in the trench, by epitaxial growth;
removing the semiconductor film at a bottom of the trench; and
making the region of the semiconductor film that is in contact with the second semiconductor layer to be of the second conductivity type and have an impurity concentration that is lower than that of the second semiconductor layer.

5. The method according to claim 4, wherein removing the semiconductor film at the bottom of the trench includes thinning the semiconductor film on the first semiconductor region, on the second semiconductor layer and on side walls of the trench, and removing the semiconductor film at the bottom of the trench.

6. The method according to claim 3, wherein the semiconductor film is formed to have a profile in which the impurity concentration decreases with proximity to a center of the trench, by a process of activating the first semiconductor region.

* * * * *